(12) United States Patent
Vaartstra et al.

(10) Patent No.: US 7,115,528 B2
(45) Date of Patent: Oct. 3, 2006

(54) SYSTEMS AND METHOD FOR FORMING SILICON OXIDE LAYERS

(75) Inventors: Brian A. Vaartstra, Nampa, ID (US); Timothy A. Quick, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/425,514

(22) Filed: Apr. 29, 2003

(65) Prior Publication Data

US 2004/0219746 A1    Nov. 4, 2004

(51) Int. Cl.
*H01L 21/31* (2006.01)

(52) U.S. Cl. .......... 438/758; 438/787

(58) Field of Classification Search ........ 438/758, 438/761, 787, 788; 427/255.27, 255.28, 427/255.37, 255.7
See application file for complete search history.

(56) References Cited

U.S. PATENT DOCUMENTS

| | | | |
|---|---|---|---|
| 4,895,709 A | 1/1990 | Laine | |
| 4,975,299 A | 12/1990 | Mir et al. | |
| 5,003,092 A | 3/1991 | Beachley, Jr. | |
| 5,124,278 A | 6/1992 | Bohling et al. | |
| 5,139,825 A | 8/1992 | Gordon et al. | |
| 5,178,911 A | 1/1993 | Gordon et al. | |
| 5,192,589 A | 3/1993 | Sandhu | |
| 5,204,314 A | 4/1993 | Kirlin | |
| 5,209,979 A | 5/1993 | Moehle et al. | |
| 5,225,561 A | 7/1993 | Kirlin et al. | |
| 5,256,244 A | 10/1993 | Ackerman | |
| 5,280,012 A | 1/1994 | Kirlin et al. | |
| 5,326,892 A | 7/1994 | Vaartstra | |
| 5,344,792 A | 9/1994 | Sandhu et al. | |
| 5,362,328 A | 11/1994 | Gardiner et al. | |
| 5,389,401 A | 2/1995 | Gordon | |
| 5,399,379 A | 3/1995 | Sandhu | |
| 5,409,735 A | 4/1995 | Winter et al. | |
| 5,453,494 A | 9/1995 | Kirlin et al. | |
| 5,478,610 A | 12/1995 | Desu et al. | |
| 5,514,822 A | 5/1996 | Scott et al. | |
| 5,527,567 A | 6/1996 | Desu et al. | |
| 5,536,323 A | 7/1996 | Kirlin et al. | |
| 5,559,260 A | 9/1996 | Scott et al. | |
| 5,616,754 A | 4/1997 | Cruse et al. | |
| 5,625,587 A | 4/1997 | Peng et al. | |
| 5,637,527 A | 6/1997 | Baek | |

(Continued)

FOREIGN PATENT DOCUMENTS

EP    0 320 169 A2    6/1989

(Continued)

OTHER PUBLICATIONS

"Atomic Layer Deposition (ALD 2002) Conference, Aug. 19-21, 2002, at Hanyang University in Seoul, Korea," Conference Schedule [online] [retrieved Jul. 8, 2003]. Retrieved from the Internet:<URL:http://www.avs.org/conferences/ald/2002/program/aug19.html>; 3 pgs.

(Continued)

*Primary Examiner*—Brook Kebede
(74) *Attorney, Agent, or Firm*—Mueting, Raasch & Gebhardt, P.A.

(57) ABSTRACT

A method of forming (and apparatus for forming) a metal oxide layer, preferably a dielectric layer, on a substrate, particularly a semiconductor substrate or substrate assembly, using a vapor deposition process and ozone with one or more metal organo-amine precursor compounds.

56 Claims, 3 Drawing Sheets

U.S. PATENT DOCUMENTS

| | | | |
|---|---|---|---|
| 5,677,002 | A | 10/1997 | Kirlin et al. |
| 5,679,815 | A | 10/1997 | Kirlin et al. |
| 5,742,322 | A | 4/1998 | Cranton et al. |
| 5,744,198 | A | 4/1998 | Hampden-Smith et al. |
| 5,772,757 | A | 6/1998 | Saito |
| 5,820,664 | A | 10/1998 | Gardiner et al. |
| 5,840,897 | A | 11/1998 | Kirlin et al. |
| 5,908,947 | A | 6/1999 | Vaartstra |
| 5,919,522 | A | 7/1999 | Baum et al. |
| 5,924,012 | A | 7/1999 | Vaartstra |
| 5,948,322 | A | 9/1999 | Baum et al. |
| 5,980,983 | A | 11/1999 | Gordon |
| 5,997,639 | A | 12/1999 | Iyer |
| 6,004,392 | A | 12/1999 | Isobe et al. |
| 6,030,454 | A | 2/2000 | Roeder et al. |
| 6,090,963 | A | 7/2000 | Zhuang et al. |
| 6,110,529 | A | 8/2000 | Gardiner et al. |
| 6,143,081 | A | 11/2000 | Shinriki et al. |
| 6,159,855 | A | 12/2000 | Vaartstra |
| 6,203,613 | B1 | 3/2001 | Gates et al. |
| 6,239,028 | B1 | 5/2001 | Vaartstra |
| 6,244,575 | B1 | 6/2001 | Vaartstra et al. |
| 6,271,094 | B1 | 8/2001 | Boyd et al. |
| 6,273,951 | B1 | 8/2001 | Vaartstra |
| 6,335,049 | B1 | 1/2002 | Basceri |
| 6,342,445 | B1 | 1/2002 | Marsh |
| 6,348,412 | B1 | 2/2002 | Vaartstra |
| 6,350,686 | B1 | 2/2002 | Vaartstra |
| 6,387,764 | B1 | 5/2002 | Curtis et al. |
| 6,402,126 | B1 | 6/2002 | Vaartstra et al. |
| 6,426,292 | B1 | 7/2002 | Vaartstra |
| 6,624,072 | B1 | 9/2003 | Vaartstra |
| 6,730,164 | B1 | 5/2004 | Vaartstra et al. |
| 6,821,341 | B1 | 11/2004 | Vaartstra |
| 2003/0188682 | A1* | 10/2003 | Tois et al. ................ 117/105 |
| 2004/0096582 | A1* | 5/2004 | Wang et al. ............ 427/255.27 |
| 2004/0197946 | A1 | 10/2004 | Vaartstra et al. |
| 2005/0022738 | A1 | 2/2005 | Vaartstra |

FOREIGN PATENT DOCUMENTS

| | | |
|---|---|---|
| EP | 0 442 704 A2 | 12/1991 |
| EP | 0 320 169 B1 | 1/1994 |

OTHER PUBLICATIONS

"Atomic Layer Deposition (ALD 2002) Conference, Aug. 19-21, 2002, at Hanyang University in Seoul, Korea," Oral and slide Presentations [CD-ROM]. Available online from the Internet:<URL:https://www.avs.org/conferences/ald/2002/cd_form.html: 2 CDs.

Gordon et al., "Vapor deposition of metal oxides and silicates: possible gate insulators for future microelectronics," *Chem. Mater.*, 2001, 13(8):2463-4.

Hawley, "The Condensed Chemical Dictionary," 10$^{th}$ Edition, Van Nostrand Reinhold Co., New York, NY, 1981; p. 225.

Hendrix et al., "Composition control of $Jf_{1-x}Si_xO_2$ films deposited on Si by chemical-vapor deposition using amide precursors," *Appl. Phys. Lett.*, Apr. 1, 2002; 80(13):2362-4.

Lee et al., "High-k gate dielectric applications using ALD Hf-based oxides," *Solid State Technology*, Jan. 2003; 46(1):45-6, 56.

Maruyama et al., "Silicon dioxide thin films prepared by chemical vapor deposition from tetrakis (dimethylamino) silane and ozone," *Appl. Phys. Lett.*, Aug. 2, 1993; 63(5):611-13.

Ohshita et al., "$Hfo_2$ growth by low-pressure chemical vapor deposition using the $Hf(N(C_2H_5)_2)_4/O_2$ gas system," *Journal of Crystal Growth*, 2001; 233-292-7.

Ohshita et al., "Using tetrakis-diethylamido-hafnium for $HfO_2$ thin-film growth in low-pressure chemical vapor deposition," *Thin Solid Films*, 2002; 406:215-18.

Ritala et al., "Atomic layer deposition of oxide thin films with metal alkoxides as oxygen sources," *Science*, Apr. 14, 2000; 288:319-21.

Suzuki et al., "Atomic Layer Deposition of $HfO_2$ using $Hf(N(C_2H_5)_2)_4$ and $O_3$," Poster Presentation, *ALD 2002 Conference*, Hanyang University, Seoul, Aug. 19, 2002; 14 pages.

Vehkamäki et al., "Growth of $SrTiO_3$ thin films by atomic layer deposition," *Electrochemical and Solid State Letters*, 1999; 2(10):504-6.

Liu et al., "Atomic Layer Deposition of Hafnium Oxide Thin Films from Tetrakis(dimethylamino)Hafnium (TDMAH) and Ozone," *Mat Res Soc Symp Proc.* 2003;765:97-102.

Vaartstra et al., Syntheses and Structures of a Series of Very Low Coordinate Barium Compounds: $Ba[N(SiMe_3)_2]_2$ $(THF)_2$, $\{Ba[N(SiMe_3)_2]_2 (THF)\}_2$, and $\{Ba[N(SiMe_3)_2]_2\}_2$, *Inorg. Chem.*, 1991; 30:121-5.

Billingham and Jenkins, "Polymerization Initiated by Titanium Amides," *Applied Polymer Symposia*, 1975;26:13-18.

Cathey, "Field Emission Displays," *International Symposium on VLSI Technology Systems and Applications, Proceedings of Technical Papers*, May 31-Jun. 2, 1995, Taipei, Taiwan, 1995:pp. 131-136.

Feingold and Katz, "Rapid thermal low-pressure metal-organic chemical vapor deposition (RT-LPMOCVD) of semiconductor, dielectric and metal gilm onto InP and related materials," *Materials Science and Engineering*: Reports, Oct. 1, 1994;13(2):57-104.

Fix et al., "Synthesis of Thin Films by Atmospheric Pressure Chemical Vapor Deposition Using Amido and Imido Titanium (IV) Compounds as Precursors," *Chemistry of Materials*, May/Jun. 1990; 2(3):235-241.

Gardiner et al., "Mononuclear Barium Diketonate Polyamine Adducts. Synthesis, Structures, and Use in MOCVD of Barium Titanate," *Chem. Mater.*, 1994;6:1967-1970.

Gordon et al., "New Liquid Precursors for chemical Vapor Deposition," *MBS Meeting*, Fall 1997, 6 pgs.

"Hawley's Condensed Chemical Dictionary- Thirteenth Edition," Eds. John Wiley & Sons, Inc., 1997; 756.

hoffman, David M., "Chemical vapour Deposition of Nitride Thin Films," *Polyhedron*, Apr. 1994; 13(8):1169-1179.

Versteeg et al., "Metalorganic Chemical Vapor Deposition By Pulsed Liquid Injection Using an Ultrasonic Nozzle: Titanium Dioxide on Sapphire from Titanium (IV) Isopropoxide," *Journal of the American Ceramic Society*, Oct. 1995;78:2763-2768.

* cited by examiner

SYSTEMS AND METHOD FOR FORMING SILICON OXIDE LAYERS

FIELD OF THE INVENTION

This invention relates to methods of forming a layer on a substrate using one or more metal precursor compounds and ozone during a vapor deposition process. The precursor compounds and methods are particularly suitable for the formation of a metal oxide layer, particularly a metal oxide dielectric layer, onto a semiconductor substrate or substrate assembly.

BACKGROUND OF THE INVENTION

Capacitors are the basic energy storage devices in random access memory devices, such as dynamic random access memory (DRAM) devices and static random access memory (SRAM) devices. They consist of two conductors, such as parallel metal or polysilicon plates, which act as the electrodes (i.e., the storage node electrode and the cell plate capacitor electrode), insulated from each other by a dielectric material.

The continuous shrinkage of microelectronic devices such as capacitors and gates over the years has led to a situation where the materials traditionally used in integrated circuit technology are approaching their performance limits. Silicon (i.e., doped polysilicon) has generally been the substrate of choice, and silicon dioxide ($SiO_2$) has frequently been used as the dielectric material with silicon to construct microelectronic devices. However, when the $SiO_2$ layer is thinned to 1 nm (i.e., a thickness of only 4 or 5 molecules), as is desired in the newest micro devices, the layer no longer effectively performs as an insulator due to the tunneling current running through it.

Thus, new high dielectric constant materials are needed to extend device performance. Such materials need to demonstrate high permittivity, barrier height to prevent tunneling, stability in direct contact with silicon, and good interface quality and film morphology. Furthermore, such materials must be compatible with the gate material, semiconductor processing temperatures, and operating conditions.

High quality dielectric materials based on $ZrO_2$ and $HfO_2$, besides others, have high dielectric constants, so are being investigated as replacements in memories for $SiO_2$ where very thin layers are required. These high crystalline multivalent metal oxide layers are thermodynamically stable in the presence of silicon, minimizing silicon oxidation upon thermal annealing, and appear to be compatible with metal gate electrodes.

This discovery has led to an effort to investigate various deposition processes to form layers, especially dielectric layers, based on zirconium and hafnium oxides and silicates. Such deposition processes have included vapor deposition, metal thermal oxidation, and high vacuum sputtering. Vapor deposition processes, which includes chemical vapor deposition (CVD) and atomic layer deposition (ALD), are very appealing as they provide for excellent control of dielectric uniformity and thickness on a substrate.

Ritala et al., "Atomic Layer Deposition of Oxide Thin Films with Metal Alkoxides as Oxygen Sources," SCIENCE, 288:319–321 (2000) describe a chemical approach to ALD of thin oxide films. In this approach, a metal alkoxide, serving as both a metal source and an oxygen source, reacts with another metal compound such as a metal chloride or metal alkyl to deposit a metal oxide on silicon without creating an interfacial silicon oxide layer. However, undesirable chlorine residues can also be formed. Furthermore, zirconium and hafnium alkyls are generally unstable and not commercially available. They would also likely leave carbon in the resultant films.

Despite these continual improvements in semiconductor dielectric layers, there remains a need for a vapor deposition process utilizing sufficiently volatile metal precursor compounds that can form a thin, high quality metal oxide layer, particularly on a semiconductor substrate using a vapor deposition process.

SUMMARY OF THE INVENTION

This invention provides, besides other things, methods of vapor depositing a metal oxide layer on a substrate. These vapor deposition methods involve forming the layer by combining one or more metal organo-amine precursor compounds with ozone. The invention also provides, besides other things, methods of depositing a silicon oxide layer on a substrate using an atomic layer deposition (ALD) process with one or more silicon organo-amine precursor compounds and ozone.

Significantly, the methods of the present invention do not require the use of water or other hydrogen-producing coreactants, thus reducing (and typically avoiding) the problem of producing a hydrogen-containing layer.

The methods of the present invention include forming a metal oxide layer on a substrate, as occurs in a method of manufacturing a semiconductor structure.

In certain embodiments, a method of the present invention includes: providing a substrate (preferably a semiconductor substrate or substrate assembly such as a silicon wafer); providing at least one precursor compound of the formula $M(NR^1R^2)_x(NR^3)_y$, wherein M is a metal, $R^1$, $R^2$, and $R^3$ are each independently hydrogen or an organic group, x is 1 or more, y is 0 or more, and the values of x and y are dependent on the oxidation state of M; providing at least one source of ozone; and contacting the at least one precursor compound and the at least one source of ozone to form a metal oxide layer (preferably a dielectric layer) on one or more surfaces of the substrate using a vapor deposition process.

In another embodiment, a method of the present invention involves: providing a substrate (preferably a semiconductor substrate or substrate assembly such as a silicon wafer) within a deposition chamber; providing a vapor that includes at least one precursor compound of the formula $M(NR^1R^2)_x(NR^3)_y$, wherein M is a metal, $R^1$, $R^2$, and $R^3$ are each independently hydrogen or an organic group, x is 1 or more, y is 0 or more, and the values of x and y are dependent on the oxidation state of M; providing a vapor that includes at least one source of ozone; and contacting the at least one precursor compound and the at least one source of ozone to form a metal oxide layer (preferably a dielectric layer) on one or more surfaces of the substrate using a vapor deposition process.

In another embodiment, the present invention also provides a method of manufacturing a memory device structure, wherein the method includes: providing a substrate having a first electrode thereon; providing at least one precursor compound of the formula $M(NR^1R^2)_x(NR^3)_y$, wherein M is a metal, $R^1$, $R^2$, and $R^3$ are each independently hydrogen or an organic group, x is 1 or more, y is 0 or more, and the values of x and y are dependent on the oxidation state of M; providing at least one source of ozone; vaporizing the precursor compound to form a vaporized precursor compound; directing the vaporized precursor compound and the ozone to the substrate to form a metal oxide dielectric layer on the first electrode of the substrate; and forming a second electrode on the dielectric layer. Preferably, the dielectric forms a capacitor layer, although a gate is also possible.

In an additional embodiment, the method includes providing at least one precursor compound of the formula $M(NR^1R^2)_x(NR^3)_y$, wherein y is 0 to 4, and x is 1 to 8. Preferably, y is 0, thereby providing at least one precursor compound of the formula $M(NR^1R^2)_x$, wherein a value of x is dependent on the oxidation state of M. Preferably the compound of formula $M(NR^1R^2)_x(NR^3)_y$ excludes silicon as M when the vapor deposition process is a chemical vapor deposition process.

In another embodiment, a method of the present invention includes forming a silicon oxide layer (typically silicon dioxide) on a substrate. One such method includes: providing a substrate (preferably a semiconductor substrate or substrate assembly such as a silicon wafer); providing at least one precursor compound of the formula $Si(NR^1R^2)_xZ_y$, wherein $R^1$ and $R^2$ are each independently hydrogen or an organic group, Z is Cl or H, x is 1 to 4, y is 0 to 4; providing at least one source of ozone; and contacting the at least one precursor compound and the at least one source of ozone to form a silicon oxide layer (preferably an $SiO_2$ insulating layer) on one or more surfaces of the substrate using an atomic layer deposition process that includes a plurality of deposition cycles.

In an additional embodiment, a method of the present invention includes forming a silicon oxide layer on a substrate by providing a substrate (preferably a semiconductor substrate or substrate assembly such as a silicon wafer) within a deposition chamber; providing at least one precursor compound of the formula $Si(NR^1R^2)_xZ_y$, wherein $R^1$ and $R^2$ are each independently hydrogen or an organic group, Z is Cl or H, x is 1 to 4, y is 0 to 4; providing at least one source of ozone; and contacting the at least one precursor compound and the at least one source of ozone to form a silicon oxide layer (preferably an $SiO_2$ insulating layer) on one or more surfaces of the substrate within the deposition chamber using an atomic layer deposition process that includes a plurality of deposition cycles.

Another method of the present invention includes a method of manufacturing a memory device structure with an atomic layer deposition process, the method includes providing a substrate having a first electrode thereon; providing at least one precursor compound of the formula $Si(NR^1R^2)_xZ_y$, wherein $R^1$ and $R^2$ are each independently hydrogen or an organic group, Z is Cl or H, x is 1 to 4, and y is 0 to 4; providing at least one source of ozone; vaporizing the precursor compound to form a vaporized precursor compound; directing the vaporized precursor compound and the ozone to the substrate to form a silicon oxide dielectric layer on the first electrode of the substrate with the atomic layer deposition process; and forming a second electrode on the dielectric layer.

The methods of the present invention can utilize a chemical vapor deposition (CVD) process, which can be pulsed, or an atomic layer deposition (ALD) process (a self-limiting vapor deposition process that includes a plurality of deposition cycles, typically with purging between the cycles). Preferably, the methods of the present invention use ALD. For certain ALD processes, the precursor compounds can be alternately introduced into a deposition chamber during each deposition cycle.

The present invention also provides a vapor deposition apparatus that includes: a vapor deposition chamber having a substrate positioned therein; one or more vessels that include at least one precursor compound of the formula $M(NR^1R^2)_x(NR^3)_y$, wherein M is a metal except silicon, $R^1$, $R^2$, and $R^3$ are each independently a hydrogen or an organic group, x is 1 or more, y is 0 or more, and the values of x and y are dependent on the oxidation state of M; and one or more sources of ozone, such as an ozone generator that delivers an ozone oxygen mixture.

The present invention further includes an atomic layer vapor deposition apparatus that includes: a deposition chamber having a substrate (preferably a semiconductor substrate or substrate assembly such as a silicon wafer) positioned therein; one or more vessels that include at least one precursor compound of the formula $Si(NR^1R^2)_xZ_y$, wherein $R^1$ and $R^2$ are each independently hydrogen or an organic group, Z is Cl or H, x is 1 to 4, and y is 0 to 4; and one or more sources of ozone such as an ozone generator that delivers an ozone oxygen mixture.

For certain embodiments, the metal oxide layer can include an alloy, a solid solution, or a nanolaminate. For certain embodiments, the metal oxide layer can include a solid solution that includes, for example, a zirconium oxide, an aluminum oxide, a tantalum oxide, a titanium oxide, a niobium oxide, a hafnium oxide, an oxide of a lanthanide, or combinations thereof.

In an additionally preferred embodiment, a solid solution of the metal oxide layer can also include a silicon oxide (including silicates) when a silicon-containing precursor compound is provided. Thus, a solid solution can have any combination of metal oxide layer, including a silicon oxide, if desired.

In addition, preferably the metal oxide layer is essentially free of carbon, nitrogen, and halogens, or compounds thereof. As used herein, "essentially free" is defined to mean that the metal oxide layer has less than about 1% by weight of carbon, nitrogen, hydrogen, halogens, or compounds thereof such that the presence of these elements and/or compounds thereof having a minor effect on the chemical, mechanical, or electrical properties of the film.

"Semiconductor substrate" or "substrate assembly" as used herein refers to a semiconductor substrate such as a base semiconductor layer or a semiconductor substrate having one or more layers, structures, or regions formed thereon. A base semiconductor layer is typically the lowest layer of silicon material on a wafer or a silicon layer deposited on another material, such as silicon on sapphire. When reference is made to a substrate assembly, various process steps may have been previously used to form or define regions, junctions, various structures or features, and openings such as capacitor plates or barriers for capacitors.

"Layer" as used herein refers to any layer that can be formed on a substrate from the precursor compounds of this invention using a vapor deposition process. The term "layer" is meant to include layers specific to the semiconductor industry, such as "barrier layer," "dielectric layer," "insulating layer," and "conductive layer." (The term "layer" is synonymous with the term "film" frequently used in the semiconductor industry.) The term "layer" is also meant to include layers found in technology outside of semiconductor technology, such as coatings on glass.

"Dielectric layer" as used herein refers to a layer (or film) having a high dielectric constant containing primarily, for example, zirconium oxides, aluminum oxides, tantalum oxides, titanium oxides, niobium oxides, hafnium oxides, an oxide of a lanthanide, or combinations thereof.

"Precursor compound" as used herein refers to an organoamine (such as diorganoamide (e.g., dialkylamide) or alkylimines-alkylamines) precursor compound, for example, capable of forming a metal oxide layer on a substrate with ozone in a vapor deposition process or a silicon dioxide layer on a substrate with ozone in an atomic layer deposition process. The organo-amine precursor compounds are all preferably liquid at the vaporization temperature, and more preferably at room temperature. In one example, the precursor compounds are organometallic compounds that form volatile by-products upon reacting.

"Deposition process" and "vapor deposition process" as used herein refer to a process in which a layer is formed on one or more surfaces of a substrate (e.g., a doped polysilicon wafer) from vaporized precursor compound(s). Specifically, one or more precursor compounds are vaporized and directed to one or more surfaces of a heated substrate (e.g., semiconductor substrate or substrate assembly) placed in a deposition chamber. These precursor compounds form (e.g., by reacting or decomposing) a non-volatile, thin, uniform, layer on the surface(s) of the substrate. For the purposes of this invention, the term "vapor deposition process" is meant to include both chemical vapor deposition processes (including pulsed chemical vapor deposition processes) and atomic layer deposition processes.

"Chemical vapor deposition" (CVD) as used herein refers to a vapor deposition process wherein the desired layer is deposited on the substrate from vaporized metal precursor compounds (and any reaction gases used) within a deposition chamber with no effort made to separate the reaction components. In contrast to a "simple" CVD process that involves the substantial simultaneous use of the precursor compounds and any reaction gases, "pulsed" CVD alternately pulses these materials into the deposition chamber, but does not rigorously avoid intermixing of the precursor and reaction gas streams, as is typically done in atomic layer deposition or ALD (discussed in greater detail below).

"Atomic layer deposition" (ALD) as used herein refers to a vapor deposition process in which numerous consecutive deposition cycles are conducted in a deposition chamber. Typically, during each cycle the precursor compound is chemisorbed to the substrate surface; excess precursor is purged out; a subsequent precursor and/or reaction gas is introduced to react with the chemisorbed layer; and excess reaction gas (if used) and by-products are removed. As compared to the one cycle chemical vapor deposition (CVD) process, the longer duration multi-cycle ALD process allows for improved control of layer thickness by self-limiting layer growth and minimizing detrimental gas phase reactions by separation of the reaction components. The term "atomic layer deposition" as used herein is also meant to include the related terms "atomic layer epitaxy" (ALE), molecular beam epitaxy (MBE), gas source MBE, organometallic MBE, and chemical beam epitaxy when performed with alternating pulses of precursor compound(s), reaction gas(es), and purge (i.e., inert carrier) gas.

"Chemisorption" as used herein refers to the chemical adsorption of vaporized reactive precursor compounds on the surface of a substrate. The adsorbed species are irreversibly bound to the substrate surface as a result of relatively strong binding forces characterized by high adsorption energies (e.g., >30 kcal/mol), comparable in strength to ordinary chemical bonds. The chemisorbed species typically form a monolayer on the substrate surface. (See "The Condensed Chemical Dictionary", 10th edition, revised by G. G. Hawley, published by Van Nostrand Reinhold Co., New York, 225 (1981)). The technique of ALD is based on the principle of the formation of a saturated monolayer of reactive precursor molecules by chemisorption. In ALD one or more appropriate precursor compounds or reaction gases are alternately introduced (e.g., pulsed) into a deposition chamber and chemisorbed onto the surfaces of a substrate. Each sequential introduction of a reactive compound (e.g., one or more precursor compounds and one or more reaction gases) is typically separated by an inert carrier gas purge. Each precursor compound co-reaction adds a new atomic layer to previously deposited layers to form a cumulative solid layer. The cycle is repeated to gradually form the desired layer thickness. It should be understood that ALD can alternately utilize one precursor compound, which is chemisorbed, and one reaction gas, which reacts with the chemisorbed species.

DETAILED DESCRIPTION OF PREFERRED EMBODIMENTS OF THE INVENTION

Figure 1:
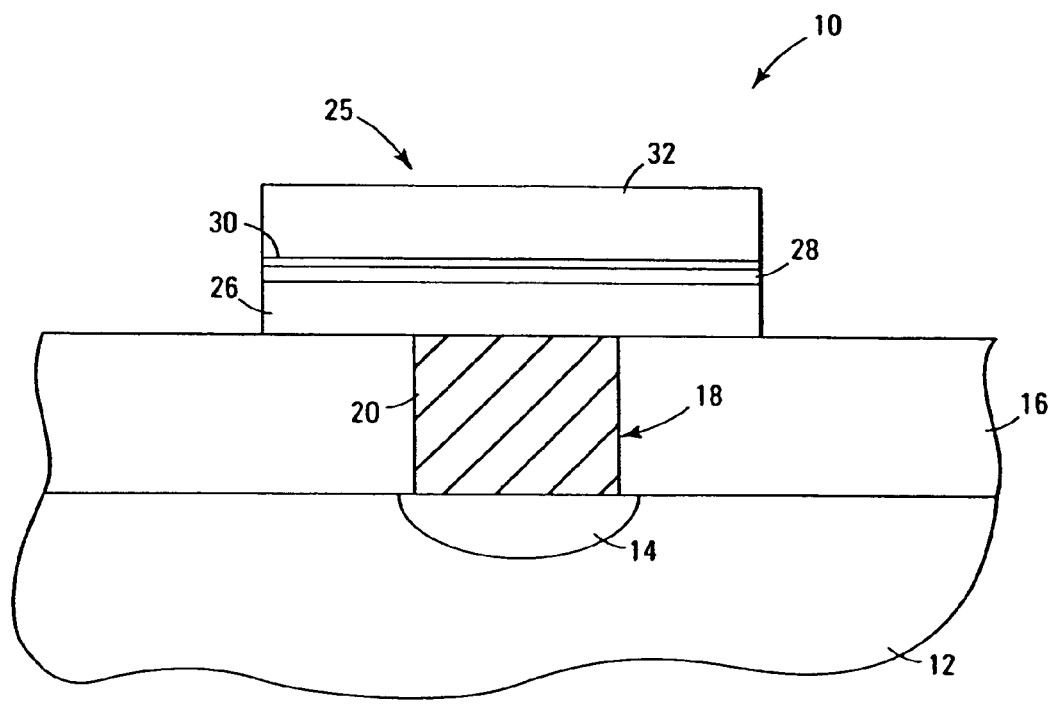
FIGS. 1–3 are exemplary capacitor constructions.

The present invention provides, besides other things, methods of forming a metal oxide layer (preferably a metal oxide dielectric layer) on a substrate (preferably a semiconductor substrate or substrate assembly) using one or more metal organo-amine precursor compounds with an ozone source. The invention also provides, besides other things, methods of depositing a silicon oxide layer (typically a silicon dioxide layer) on a substrate using an atomic layer deposition (ALD) process. Preferably, the ALD process involves forming the silicon oxide layer by combining one or more silicon organo-amine precursor compounds with ozone.

Preferably, the organo-amine precursor compounds include precursor compounds having the formula $M(NR^1R^2)_x(NR^3)_y$ (Formula I), wherein M is a metal, $R^1$, $R^2$, and $R^3$ are each independently a hydrogen or an organic group, x is 1 or more, y is 0 or more, and the values of x and y are dependent on the oxidation state of M. In an additional preferred embodiment, the method includes providing at least one precursor compound of the formula $M(NR^1R^2)_x(NR^3)_y$, wherein y is 0 to 4 and x is 1 to 8. Preferably, y is 0, thereby providing at least one precursor compound of the formula $M(NR^1R^2)_x$ (Formula II), wherein a value of x is dependent on the oxidation state of M.

In Formulas I and II: M can be any metal (main group, transition metal, lanthanide, or metalloid (thereby including B, Al, Ge, Si, As, Sb, Te, Po, and At) although silicon is excluded for certain embodiments, particularly when used in a chemical vapor deposition process; each R (i.e., $R^1$, $R^2$, and $R^3$) is independently a hydrogen or an organic group; preferably, x is 1 to 8, more preferably, x is 2 to 6; preferably, y is 0 to 4, more preferably y is 0 to 2. Preferably, in Formula II, the value of x is 4 or 5 and the value of y is 0.

The metal oxide layer formed according to the present invention may include one or more different metals and is typically of the formula $M_nO_m$ (Formula III), wherein M can be one or more of the metals as defined above (i.e., the oxide can be a single metal oxide or a mixed metal oxide). Preferably, the metal oxide layer is a single metal oxide (i.e., includes only one metal). It is possible, however, for the metal oxide layer to include two or more different metals.

If the metal oxide layer includes two or more different metals, the metal oxide layer can be in the form of alloys, solid solutions, or nanolaminates. Preferably, these have dielectric properties. The metal oxide layer (particularly if it is a dielectric layer) preferably includes one or more of $ZrO_2$, $HfO_2$, $Ta_2O_3$, $Al_2O_3$, $Nb_2O_5$, $Ta_2O_5$, $TiO_2$, and an oxide of a lanthanide.

Surprisingly, the metal oxide layer formed according to the present invention is essentially free of carbon, nitrogen, hydrogen, and halogens, or compounds thereof. As used herein, "essentially free" is defined to mean that the metal oxide layer has less than about 1% by weight of carbon, nitrogen, hydrogen, halogens, or compounds thereof such that the presence of these elements and/or compounds thereof have minor effect on the chemical, mechanical, or electrical properties of the film.

The substrate on which the metal oxide layer is formed is preferably a semiconductor substrate or substrate assembly. Any suitable semiconductor material is contemplated, such as for example, conductively doped polysilicon (for this invention simply referred to as "silicon"). A substrate assembly may also contain a layer that includes platinum, iridium, rhodium, ruthenium, ruthenium oxide, titanium nitride, tantalum nitride, tantalum-silicon-nitride, silicon dioxide, silicon nitride, aluminum, gallium arsenide, glass, etc., and other existing or to be-developed materials used in semiconductor constructions, such as dynamic random access memory (DRAM) devices and static random access memory (SRAM) devices, for example.

Substrates other than semiconductor substrates or substrate assemblies can be used in methods of the present invention. These include, for example, fibers, wires, etc. If the substrate is a semiconductor substrate or substrate assembly, the layers can be formed directly on the lowest semiconductor surface of the substrate, or they can be formed on any of a variety of the layers (i.e., surfaces) as in a patterned wafer, for example.

The precursor compounds described herein may include a wide variety of metals. As used herein, "metal" includes all metals of the periodic table (including main group metals, transition metals, lanthanides, actinides, and metalloid such as B, Al, Ge, Si, As, Sb, Te, Po, and At but excluding Si for certain embodiments). For certain methods of the present invention, preferably, each metal M is selected from the group of metals of Group 3 (Sc, Y), Group 4 (Ti, Zr, Hf), 5 (V, Nb, Ta), Group 13 (Al, Ga, In), the lanthanides (La, Ce, Pr, etc.) of the Periodic Chart, and combinations thereof. Preferably, M is selected from the group consisting of Al, Ti, Zr, Hf, Nb, Ta, a lanthanide (e.g., La, Ce, Pr, Nd, Pm, Sm, Eu, Gd, Tb, Dy, Ho, Er, Tm, Yb, and Lu), and combinations thereof. More preferably, M is selected from the group consisting of Ti, Hf, Nb, Ta, Al, Zr, and combinations thereof.

In Formula I: M is a metal selected from Group 3 (Sc, Y), Group 4 (Ti, Zr, Hf), Group 5 (V, Nb, Ta), Group 13 (Al, Ga, In), the lanthanides of the Periodic Table, and combinations thereof. Preferred and more preferred metals for Formula I are as defined above.

In Formula II: M is a metal selected from Groups 3 (Sc, Y), 4 (Ti, Zr, Hf), 5 (V, Nb, Ta), the lanthanides of the Periodic Table, and combinations thereof. Preferably, M is selected from the group consisting of Ti, Zr, Hf, Nb, Ta, a lanthanide (e.g., La, Ce, Pr, Nd, Pm, Sm, Eu, Gd, Tb, Dy, Ho, Er, Tm, Yb, and Lu), and combinations thereof. For certain methods of the present invention, preferably, M is selected from the group consisting of Ti, Zr, Hf, Nb, Ta, and combinations thereof.

Preferably, the precursor compounds useful in this invention are of the formula $M(NR^1R^2)_x(NR^3)_y$ (Formula I), wherein M is a metal, $R^1$, $R^2$ and $R^3$ are each independently a hydrogen or an organic group (as described in greater detail below), and x is 1 to 8 and y is 0 to 4, depending on the oxidation state of M. In an additional preferred embodiment, the precursor compounds useful in this invention are of the formula $M(NR^1R^2)_x$ (Formula II), wherein M is a metal, $R^1$ and $R^2$ are each independently a hydrogen or an organic group (as described in greater detail below), and the value of x is dependent on the oxidation state of M, and preferably x is 4 or 5 depending on the oxidation state of M.

For ALD processes, the metal M of the compounds of Formula I and II can further include all metals of the Periodic Table (including main group metals, transition metals, lanthanides, actinides, and metalloids including Si).

For the CVD or ALD processes, organo-amine precursor compounds include precursor compounds having the formula $Si(NR^1R^2)_xZ_y$ (Formula III), wherein $R^1$ and $R^2$ are each independently hydrogen or an organic group, Z is Cl or H, x is 1 to 4, and y is 0 to 4; and precursor compounds having the formula $Si(NR^1R^2)_x$(Formula IV), wherein $R^1$ and $R^2$ are each independently an organic group, x is 4.

As used herein, the term "organic group" is used for the purpose of this invention to mean a hydrocarbon group that is classified as an aliphatic group, cyclic group, or combination of aliphatic and cyclic groups (e.g., alkaryl and aralkyl groups). In the context of the present invention, suitable organic groups for precursor compounds of this invention are those that do not interfere with the formation of a metal oxide layer using vapor deposition techniques. In the context of the present invention, the term "aliphatic group" means a saturated or unsaturated linear or branched hydrocarbon group. This term is used to encompass alkyl, alkenyl, and alkynyl groups, for example. The term "alkyl group" means a saturated linear or branched monovalent hydrocarbon group including, for example, methyl, ethyl, n-propyl, isopropyl, t-butyl, amyl, heptyl, and the like. The term "alkenyl group" means an unsaturated, linear or branched monovalent hydrocarbon group with one or more olefinically unsaturated groups (i.e., carbon-carbon double bonds), such as a vinyl group. The term "alkynyl group" means an unsaturated, linear or branched monovalent hydrocarbon group with one or more carbon-carbon triple bonds. The term "cyclic group" means a closed ring hydrocarbon group that is classified as an alicyclic group, aromatic group, or heterocyclic group. The term "alicyclic group" means a cyclic hydrocarbon group having properties resembling those of aliphatic groups. The term "aromatic group" or "aryl group" means a mono- or polynuclear aromatic hydrocarbon group. The term "heterocyclic group" means a closed ring hydrocarbon in which one or more of the atoms in the ring is an element other than carbon (e.g., nitrogen, oxygen, sulfur, etc.).

As a means of simplifying the discussion and the recitation of certain terminology used throughout this application, the terms "group" and "moiety" are used to differentiate between chemical species that allow for substitution or that may be substituted and those that do not so allow for substitution or may not be so substituted. Thus, when the term "group" is used to describe a chemical substituent, the described chemical material includes the unsubstituted group and that group with nonperoxidic O, N, Si, F, or S atoms, for example, in the chain as well as carbonyl groups or other conventional substituents. Where the term "moiety" is used to describe a chemical compound or substituent, only an unsubstituted chemical material is intended to be included. For example, the phrase "alkyl group" is intended to include not only pure open chain saturated hydrocarbon alkyl substituents, such as methyl, ethyl, propyl, t-butyl, and the like, but also alkyl substituents bearing further substituents known in the art, such as hydroxy, alkoxy, alkylsulfonyl, halogen atoms, cyano, nitro, amino, carboxyl, etc. Thus, "alkyl group" includes ether groups, haloalkyls, nitroalkyls, carboxyalkyls, hydroxyalkyls, sulfoalkyls, etc. On the other hand, the phrase "alkyl moiety" is limited to the inclusion of only pure open chain saturated hydrocarbon alkyl substituents, such as methyl, ethyl, propyl, t-butyl, and the like.

For all the precursor compounds of this invention, each R (i.e., $R^1$, $R^2$, and $R^3$) is independently and preferably hydrogen or an organic group, more preferably a (C1–C10) organic group, even more preferably a (C1–C8) organic group, even more preferably a (C1–C6) organic group, and even more preferably a "lower" (i.e., C1–C4) organic group. Even more preferably, each of these organic groups is an alkyl group. Most preferably, each organic group is an organic moiety, and preferably, an alkyl moiety (particularly methyl and ethyl moieties).

In certain embodiments, the carbon atoms of the R groups are optionally replaced by or substituted with silicon (e.g., $R=SiMe_3$ of $SiHMe_2$), fluorine (e.g., fluorocarbyl groups), oxygen, and/or nitrogen atoms or groups containing such atoms. So, the R groups can each independently be organic groups containing silicon substituted for one or more of the carbon atoms. Thus, silylated imine-amines and silylated amines are within the scope of Formulas I and II, respectively. Also, such heteroatoms may bond to the metal, thereby forming multidentate ligands.

For the compounds of Formula I, $M(NR^1R^2)_x(NR^3)_y$, each R is preferably a (C1–C6) organic group. Examples of suitable precursor compounds include $Al(NMe_2)_2(N(Me)CH_2CH_2NMe_2)$ and $Ta(N-^tBu)(NEt_2)_3$, which are either commercially available from sources such as Strem Chemical Co., or they can be prepared using standard techniques (e.g., by reacting metal chlorides with the corresponding lithium dialkyl amides).

For the compounds of Formula II, $M(NR^1R^2)_x$, each R is preferably a (C1–C6) organic group.

For hafnium precursor compounds of the formula $Hf(NR^1R^2)_4$, $R^1$ and $R^2$ are preferably both methyl, both ethyl, or one each of methyl and ethyl. Examples of suitable hafnium precursor compounds include tetrakis(dimethylamino) hafnium and tetrakis(ethylmethylamino) hafnium, the latter available from Sigma-Aldrich Chemical Co.

For zirconium precursor compounds of the formula $Zr(NR^1R^2)_4$, $R^1$ and $R^2$ are preferably both methyl, both ethyl, or one each of methyl and ethyl. Examples of suitable zirconium precursor compounds include tetrakis(dimethylamino) zirconium, tetrakis(diethylamino) zirconium and tetrakis(ethylmethylamino) zirconium, all available from Sigma-Aldrich Chemical Co.

For the titanium precursor compounds of the formula $Ti(NR^1R^2)_4$, $R^1$ and $R^2$ are preferably both methyl, both ethyl, or one each of methyl and ethyl. Examples of suitable titanium precursor compounds include tetrakis(dimethylamino) titanium, tetrakis(diethylamino) titanium, and tetrakis(ethylmethylamino) titanium, all available from Sigma-Aldrich Chemical Co.

For the niobium precursor compounds of the formula $Nb(NR^1R^2)_5$, $R^1$ and $R^2$ are preferably both methyl, both ethyl, or one each of methyl and ethyl. Examples of suitable niobium precursor compounds include pentakis(ethylmethylamino) niobium available from ATMI (Danbury, Conn.).

For the tantalum precursor compounds of the formula $Ta(NR^1R^2)_3(NR^3)$, $R^1$ and $R^2$ are preferably both methyl, both ethyl, or one each of methyl and ethyl, and $R^3$ is tert-butyl. Examples of suitable tantalum precursor compounds include $Ta(N-^tBu)(NEt_2)_3$ available from InorgTech (Mildenhall, Suffolk, UK).

Various precursor compounds can be used in various combinations, optionally with one or more organic solvents (particularly for CVD processes), to form a precursor composition. The precursor compounds may be liquids or solids at room temperature (preferably, they are liquids at the vaporization temperature). Typically, they are liquids sufficiently volatile to be employed using known vapor deposition techniques. However, as solids they may also be sufficiently volatile that they can be vaporized or sublimed from the solid state using known vapor deposition techniques.

The precursor compounds can be vaporized in the presence of an inert carrier gas if desired. Additionally, an inert carrier gas can be used in purging steps in an ALD process. The inert carrier gas is typically selected from the group consisting of nitrogen, helium, argon, and combinations thereof. In the context of the present invention, an inert carrier gas is one that does not interfere with the formation of the oxide layers of the present invention.

The deposition process for this invention is a vapor deposition process. Vapor deposition processes are generally favored in the semiconductor industry due to the process capability to quickly provide highly conformal layers even within deep contacts and other openings. Chemical vapor deposition (CVD) and atomic layer deposition (ALD) are two vapor deposition processes often employed to form thin, continuous, uniform, metal oxide (preferably dielectric) layers onto semiconductor substrates. Using either vapor deposition process, typically one or more precursor compounds are vaporized in a deposition chamber and optionally combined with one or more reaction gases to form a metal oxide layer onto a substrate. It will be readily apparent to one skilled in the art that the vapor deposition process may be enhanced by employing various related techniques such as plasma assistance, photo assistance, laser assistance, as well as other techniques.

The final layer formed preferably has a thickness in the range of about 10 Å to about 500 Å. Preferably, the thickness of the metal oxide layer is in the range of about 30 Å to about 100 Å.

For certain embodiments, the layer formed using the methods of the present invention are dielectric layers. For certain other embodiments, insulating layers are formed, particularly when silicon dioxide is formed.

For certain embodiments, the metal oxide layer can include an alloy, a solid solution, or a nanolaminate. For certain embodiments, the metal oxide layer can include a solid solution that includes, for example, a zirconium oxide, an aluminum oxide, a tantalum oxide, a titanium oxide, a niobium oxide, a hafnium oxide, an oxide of a lanthanide, or combinations thereof.

In an additionally preferred embodiment, a solid solution of the metal oxide layer can also include a silicon oxide (including silicates) when a silicon-containing precursor compound is provided. Thus, a solid solution can have any combination of metal oxide layer, including a silicon oxide, if desired.

Chemical vapor deposition (CVD) has been extensively used for the preparation of metal oxide layers, such as dielectric layers, in semiconductor processing because of its ability to provide highly conformal and high quality dielectric layers at relatively fast processing times. The desired precursor compounds are vaporized and then introduced into a deposition chamber containing a heated substrate with reaction gases and/or inert carrier gases. In a typical CVD process, vaporized precursors are contacted with reaction gas(es) at the substrate surface to form a layer (e.g., dielectric layer). The single deposition cycle is allowed to continue until the desired thickness of the layer is achieved.

Typical CVD processes generally employ precursor compounds in vaporization chambers that are separated from the process chamber wherein the deposition surface or wafer is located. For example, liquid precursor compounds are typically placed in bubblers and heated to a temperature at which they vaporize, and the vaporized liquid precursor compound is then transported by an inert carrier gas passing over the bubbler or through the liquid precursor compound. The vapors are then swept through a gas line to the deposition chamber for depositing a layer on substrate surface(s) therein. Many techniques have been developed to precisely control this process. For example, the amount of precursor material transported to the deposition chamber can be precisely controlled by the temperature of the reservoir containing the precursor compound and by the flow of an inert carrier gas bubbled through or passed over the reservoir.

Preferred embodiments of the metal oxide precursor compounds described herein are particularly suitable for chemical vapor deposition (CVD). The deposition temperature at the substrate surface is preferably held at a temperature in a range of about 100° C. to about 600° C., more preferably in the range of about 200° C. to about 500° C. The deposition chamber pressure is preferably maintained at a deposition pressure of about 0.1 torr to about 10 torr. The partial pressure of precursor compounds in the inert carrier gas is preferably about 0.001 torr to about 10 torr.

Several modifications of the CVD process and chambers are possible, for example, using atmospheric pressure chemical vapor deposition, low pressure chemical vapor deposition (LPCVD), plasma enhanced chemical vapor deposition (PECVD), hot wall or cold wall reactors or any other chemical vapor deposition technique. Furthermore, pulsed CVD can be used, which is similar to ALD (discussed in greater detail below) but does not rigorously avoid intermixing of precursor and reactant gas streams. Also, for pulsed CVD, the deposition thickness is dependent on the exposure time, as opposed to ALD, which is self-limiting (discussed in greater detail below).

A typical CVD process may be carried out in a chemical vapor deposition reactor, such as a deposition chamber available under the trade designation of 7000 from Genus, Inc. (Sunnyvale, Calif.), a deposition chamber available under the trade designation of 5000 from Applied Materials, Inc. (Santa Clara, Calif.), or a deposition chamber available under the trade designation of Prism from Novelus, Inc. (San Jose, Calif.). However, any deposition chamber suitable for performing CVD may be used.

Alternatively, and preferably, the vapor deposition process employed in the methods of the present invention is a multi-cycle ALD process. More preferably, the multi-cycle ALD process is used when the compounds of Formula I and II include M as Si. Such a process is advantageous (particularly over a CVD process) in that in provides for optimum control of atomic-level thickness and uniformity to the deposited layer (e.g., dielectric layer) and to expose the precursor compounds (both metal precursor compounds and silicon precursor compounds) to lower volatilization and reaction temperatures to minimize degradation. Typically, in an ALD process, each reactant is pulsed sequentially onto a suitable substrate, typically at deposition temperatures of about 25° C. to about 400° C. (preferably about 150° C. to about 300° C.), which is generally lower than presently used in CVD processes. Under such conditions the film growth is typically self-limiting (i.e., when the reactive sites on a surface are used up in an ALD process, the deposition generally stops), insuring not only excellent conformality but also good large area uniformity plus simple and accurate thickness control. Due to alternate dosing of the precursor compounds and/or reaction gases, detrimental vapor-phase reactions are inherently eliminated, in contrast to the CVD process that is carried out by continuous coreaction of the precursors and/or reaction gases. (See Vehkamaki et al, "Growth of $SrTiO_3$ and $BaTiO_3$ Thin Films by Atomic Layer Deposition," Electrochemical and Solid-State Letters, 2(10): 504–506 (1999)).

A typical ALD process includes exposing an initial substrate to a first chemical species (e.g., a precursor compound of Formulas I–IV) to accomplish chemisorption of the species onto the substrate. Theoretically, the chemisorption forms a monolayer that is uniformly one atom or molecule thick on the entire exposed initial substrate. In other words, a saturated monolayer. Practically, chemisorption might not occur on all portions of the substrate. Nevertheless, such an imperfect monolayer is still a monolayer in the context of the present invention. In many applications, merely a substantially saturated monolayer may be suitable. A substantially saturated monolayer is one that will still yield a deposited layer exhibiting the quality and/or properties desired for such layer.

The first species is purged from over the substrate and ozone is provided to react with the first monolayer of the first species. The ozone is then purged and a second chemical species (e.g., a different precursor compound of Formulas I–IV) is then purged form over the substrate and ozone is provided to react with the monolayer of the second species. The steps are repeated with exposure of the first species to the ozone. In some cases, the two monolayers may be of the same species. In an additional embodiment, the ozone used in the present invention may be mixed with oxygen and/or with inert gases.

Purging may involve a variety of techniques including, but not limited to, contacting the substrate and/or monolayer with a carrier gas and/or lowering pressure to below the deposition pressure to reduce the concentration of a species contacting the substrate and/or chemisorbed species. Examples of carrier gases include $N_2$, Ar, He, etc. Purging may instead include contacting the substrate and/or monolayer with any substance that allows chemisorption byproducts to desorb and reduces the concentration of a contacting species preparatory to introducing another species. The contacting species may be reduced to some suitable concentration or partial pressure known to those skilled in the art based on the specifications for the product of a particular deposition process.

ALD is often described as a self-limiting process, in that a finite number of sites exist on a substrate to which the first species may form chemical bonds. The second species might only bond to the first species and thus may also be self-limiting. Once all of the finite number of sites on a substrate are bonded with a first species, the first species will often not bond to other of the first species already bonded with the substrate. However, process conditions can be varied in ALD to promote such bonding and render ALD not self-limiting. Accordingly, ALD may also encompass a species forming other than one monolayer at a time by stacking of a species, forming a layer more than one atom or molecule thick.

The described method indicates the "substantial absence" of the second precursor (i.e., second species) during chemisorption of the first precursor since insignificant amounts of the second precursor might be present. According to the knowledge and the preferences of those with ordinary skill in the art, a determination can be made as to the tolerable amount of second precursor and process conditions selected to achieve the substantial absence of the second precursor.

Thus, during the ALD process, numerous consecutive deposition cycles are conducted in the deposition chamber, each cycle depositing a very thin metal oxide layer or a very thin silicon dioxide layer (usually less than one monolayer such that the growth rate on average is from about 0.2 to about 3.0 Angstroms per cycle), until a layer of the desired thickness is built up on the substrate of interest. The layer deposition is accomplished by alternately introducing (i.e., by pulsing) precursor compounds into the deposition chamber containing a semiconductor substrate, chemisorbing the precursor compound(s) as a monolayer onto the substrate surfaces, and then reacting the chemisorbed precursor compound(s) with ozone. The pulse duration of precursor compound(s) and inert carrier gas(es) is sufficient to saturate the substrate surface. Typically, the pulse duration is from about 0.1 to about 5 seconds, preferably from about 0.2 to about 1 second.

In comparison to the predominantly thermally driven CVD, ALD is predominantly chemically driven. Accordingly, ALD is often conducted at much lower temperatures than CVD. During the ALD process, the substrate temperature is maintained at a temperature sufficiently low to maintain intact bonds between the chemisorbed precursor compound(s) and the underlying substrate surface and to prevent decomposition of the precursor compound(s). The temperature is also sufficiently high to avoid condensation of the precursor compounds(s). Typically the substrate temperature is kept within the range of about 25° C. to about 400° C. (preferably about 150° C. to about 300° C.), which is generally lower than presently used in CVD processes. Thus, the first species or precursor compound is chemisorbed at this temperature. Surface reaction of the precursor compound can occur at substantially the same temperature as chemisorption of the precursor or, less preferably, at a substantially different temperature. Clearly, some small variation in temperature, as judged by those of ordinary skill, can occur but still be a substantially same temperature by providing a reaction rate statistically the same as would occur at the temperature of the precursor chemisorption. Chemisorption and subsequent reactions could instead occur at exactly the same temperature.

For a typical ALD process, the pressure inside the deposition chamber is kept at about $10^{-4}$ torr to about 1 torr, preferably about $10^{-4}$ torr to about 0.1 torr. Typically, the deposition chamber is purged with an inert carrier gas after the vaporized precursor compound(s) have been introduced into the chamber and/or reacted for each cycle. The inert carrier gas(es) can also be introduced with the vaporized precursor compound(s) during each cycle.

The reactivity of a precursor compound can significantly influence the process parameters in ALD. Under typical CVD process conditions, a highly reactive compound may react in the gas phase generating particulates, depositing prematurely on undesired surfaces, producing poor films, and/or yielding poor step coverage or otherwise yielding non-uniform deposition. For at least such reason, a highly reactive compound might be considered not suitable for CVD. However, some compounds not suitable for CVD are superior ALD precursors. For example, if the first precursor is gas phase reactive with the second precursor, such a combination of compounds might not be suitable for CVD, although they could be used in ALD. In the CVD context, concern might also exist regarding sticking coefficients and surface mobility, as known to those skilled in the art, when using highly gas-phase reactive precursors, however, little or no such concern would exist in the ALD context.

After layer formation on the substrate, an annealing process can be optionally performed in situ in the deposition chamber in a nitrogen atmosphere or oxidizing atmosphere. Preferably, the annealing temperature is within the range of about 400° C. to about 1000° C. Particularly after ALD, the annealing temperature is more preferably about 400° C. to about 750° C., and most preferably about 600° C. to about 700° C. Alternatively, the annealing process can also include annealing in a plasma. The annealing operation is preferably performed for a time period of about 0.5 minute to about 60 minutes and more preferably for a time period of about 1 minute to about 10 minutes. One skilled in the art will recognize that such temperatures and time periods may vary. For example, furnace anneals and rapid thermal annealing may be used, and further, such anneals may be performed in one or more annealing steps.

As stated above, the use of the complexes and methods of forming films of the present invention are beneficial for a wide variety of thin film applications in semiconductor structures, particularly those using high dielectric materials. For example, such applications include capacitors such as planar cells, trench cells (e.g., double sidewall trench capacitors), stacked cells (e.g., crown, V-cell, delta cell, multifingered, or cylindrical container stacked capacitors), as well as field effect transistor devices. Thus, for certain embodiments, the dielectric layer forms a capacitor layer. Alternatively, the dielectric layer forms a gate.

A specific example of where a dielectric layer is formed according to the present invention is a capacitor construction. Exemplary capacitor constructions are described with reference to FIGS. 1–3. Referring to FIG. 1, a semiconductor wafer fragment 10 includes a capacitor construction 25 formed by a method of the present invention. Wafer fragment 10 includes a substrate 12 having a conductive diffusion area 14 formed therein. Substrate 12 can include, for example, monocrystalline silicon. An insulating layer 16, typically borophosphosilicate glass (BPSG), is provided over substrate 12, with a contact opening 18 provided therein to diffusion area 14. A conductive material 20 fills contact opening 18, with material 20 and oxide layer 18 having been planarized as shown. Material 20 might be any suitable conductive material, such as, for example, tungsten or conductively doped polysilicon. Capacitor construction 25 is provided atop layer 16 and plug 20, and electrically connected to node 14 through plug 20.

Capacitor construction 25 includes a first capacitor electrode 26, which has been provided and patterned over node 20. Exemplary materials include conductively doped polysilicon, Pt, Ir, Rh, Ru, $RuO_2$, $IrO_2$, $RhO_2$. A capacitor dielectric layer 28 is provided over first capacitor electrode 26. The materials of the present invention can be used to form the capacitor dielectric layer 28. Preferably, if first capacitor electrode 26 includes polysilicon, a surface of the polysilicon is cleaned by an in situ HF dip prior to deposition of the dielectric material. An exemplary thickness for layer 28 in accordance with 256 Mb integration is 100 Angstroms.

A diffusion barrier layer 30 is provided over dielectric layer 28. Diffusion barrier layer 30 includes conductive materials such as TiN, TaN, metal silicide, or metal silicide-nitride, and can be provided by CVD, for example, using conditions well known to those of skill in the art. After formation of barrier layer 30, a second capacitor electrode 32 is formed over barrier layer 30 to complete construction of capacitor 25. Second capacitor electrode 32 can include constructions similar to those discussed above regarding the first capacitor electrode 26, and can accordingly include, for example, conductively doped polysilicon. Diffusion barrier layer 30 preferably prevents components (e.g., oxygen) from diffusing from dielectric material 28 into electrode 32. If, for example, oxygen diffuses into a silicon-containing electrode 32, it can undesirably form $SiO_2$, which will significantly reduce the capacitance of capacitor 25. Diffusion barrier layer 30 can also prevent diffusion of silicon from metal electrode 32 to dielectric layer 28.

Figure 2:
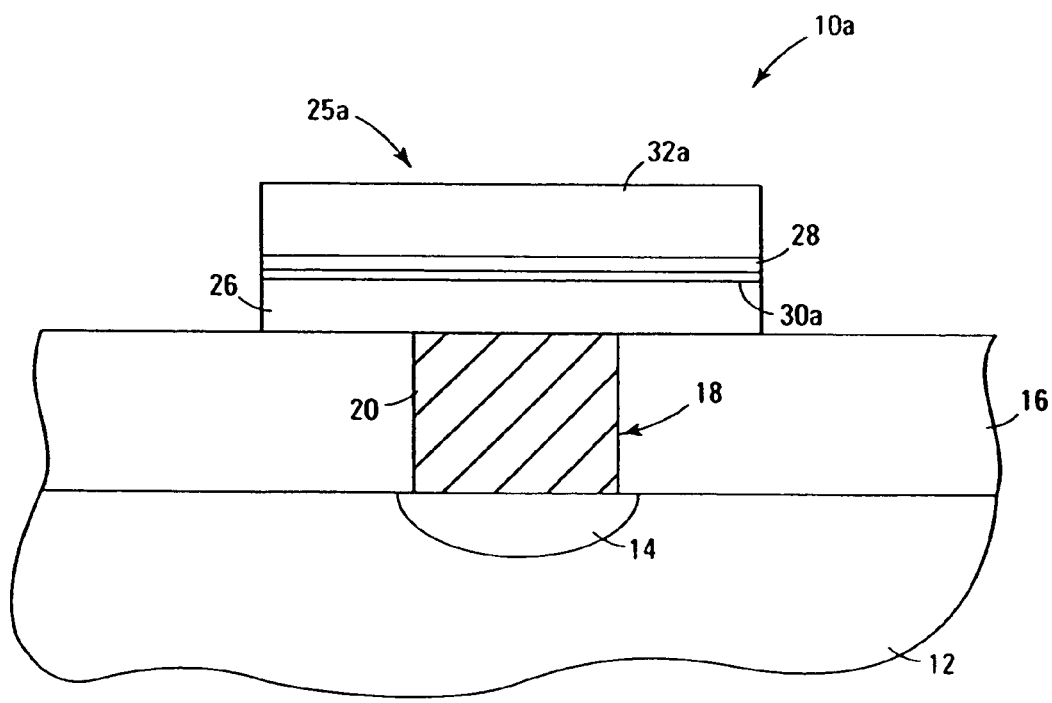

FIG. 2 illustrates an alternative embodiment of a capacitor construction. Like numerals from FIG. 1 have been utilized where appropriate, with differences indicated by the suffix "a". Wafer fragment 10a includes a capacitor construction 25a differing from the construction 25 of FIG. 2 in provision of a barrier layer 30a between first electrode 26 and dielectric layer 28, rather than between dielectric layer 28 and second capacitor electrode 32. Barrier layer 30a can include constructions identical to those discussed above with reference to FIG. 1.

Figure 3:
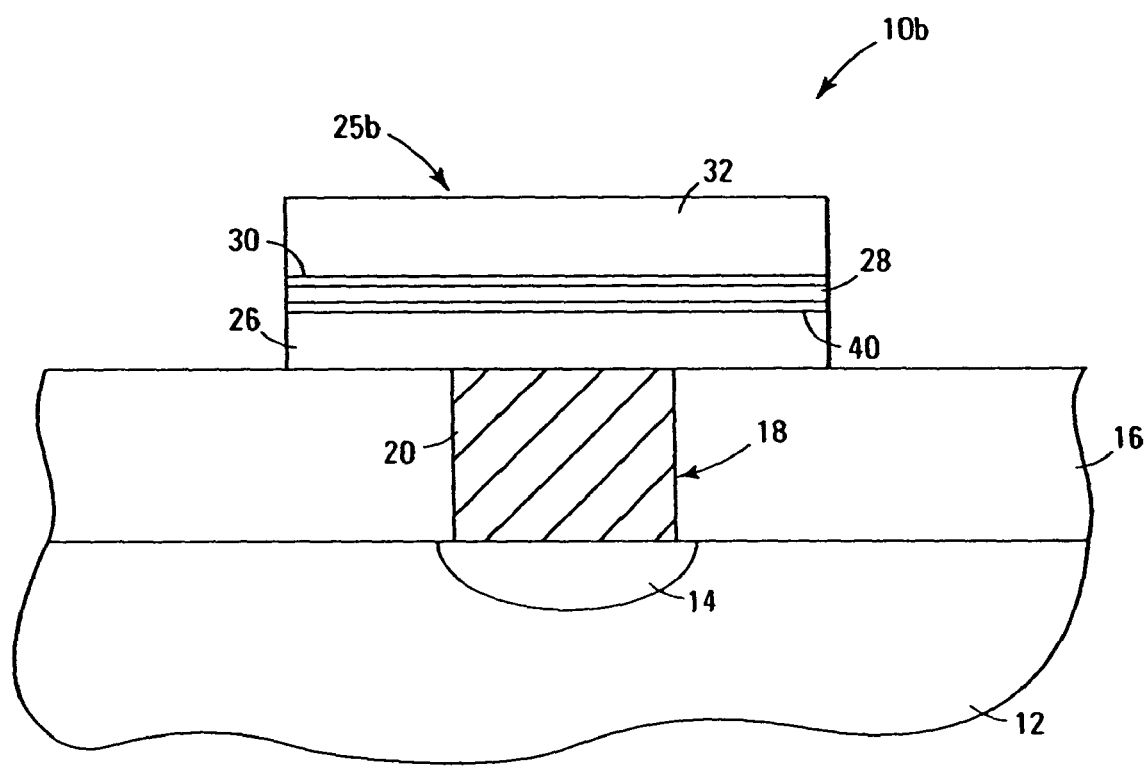

FIG. 3 illustrates yet another alternative embodiment of a capacitor construction. Like numerals from FIG. 1 are utilized where appropriate, with differences being indicated by the suffix "b" or by different numerals. Wafer fragment 10b includes a capacitor construction 25b having the first and second capacitor plate 26 and 32, respectively, of the first described embodiment. However, wafer fragment 10b differs from wafer fragment 10 of FIG. 2 in that wafer fragment 10b includes a second barrier layer 40 in addition to the barrier layer 30. Barrier layer 40 is provided between first capacitor electrode 26 and dielectric layer 28, whereas barrier layer 30 is between second capacitor electrode 32 and dielectric layer 28. Barrier layer 40 can be formed by methods identical to those discussed above with reference to FIG. 1 for formation of the barrier layer 30.

In the embodiments of FIGS. 1–3, the barrier layers are shown and described as being distinct layers separate from the capacitor electrodes. It is to be understood, however, that the barrier layers can include conductive materials and can accordingly, in such embodiments, be understood to include at least a portion of the capacitor electrodes. In particular embodiments an entirety of a capacitor electrode can include conductive barrier layer materials.

Figure 4:
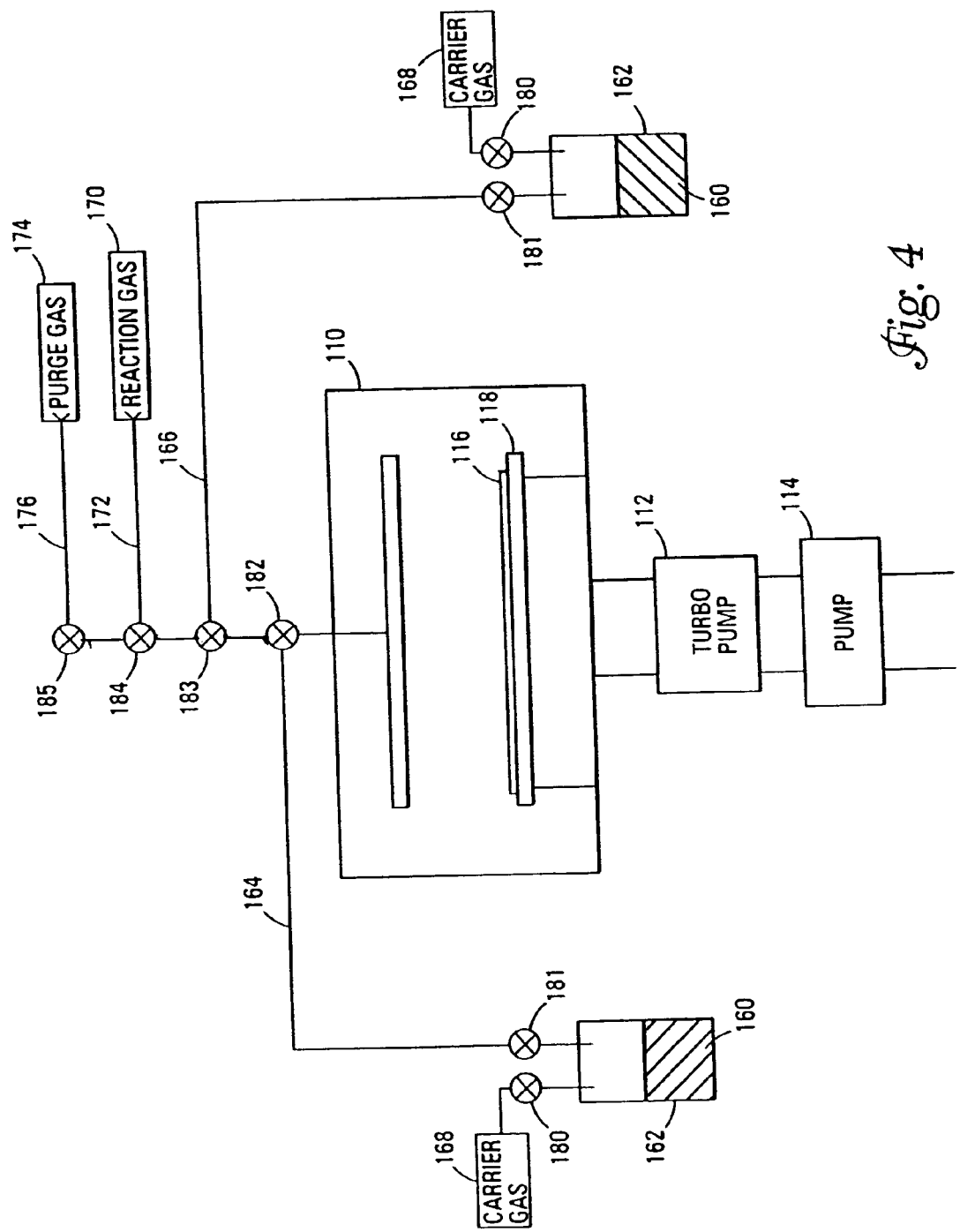
FIG. 4 is a perspective view of a vapor deposition coating system suitable for use in the method of the present invention.

A system that can be used to perform vapor deposition processes (chemical vapor deposition or atomic layer deposition) of the present invention is shown in FIG. 4. The system includes an enclosed vapor deposition chamber 110, in which a vacuum may be created using turbo pump 112 and backing pump 114. One or more substrates 116 (e.g., semiconductor substrates or substrate assemblies) are positioned in chamber 110. A constant nominal temperature is established for substrate 116, which can vary depending on the process used. Substrate 116 may be heated, for example, by an electrical resistance heater 118 on which substrate 116 is mounted. Other known methods of heating the substrate may also be utilized.

In this process, precursor compounds 160 (e.g., a refractory metal precursor compound and an ether) are stored in vessels 162. The precursor compounds are vaporized and separately fed along lines 164 and 166 to the deposition chamber 110 using, for example, an inert carrier gas 168. A reaction gas 170 may be supplied along line 172 as needed. Also, a purge gas 174, which is often the same as the inert carrier gas 168, may be supplied along line 176 as needed. As shown, a series of valves 180–185 are opened and closed as required.

The following examples are offered to further illustrate the various specific and preferred embodiments and techniques. It should be understood, however, that many variations and modifications may be made while remaining within the scope of the present invention, so the scope of the invention is not intended to be limited by the examples. Unless specified otherwise, all percentages shown in the examples are percentages by weight.

EXAMPLE

Example 1

Atomic Layer Deposition of $HfO_2$

Using an ALD process, precursor compounds hafnium dimethylamide, $Hf(N(CH_3)_2)_4$ (Strem Chemicals, Newbury Port, Mass.), and an ozone/oxygen ($O_3/O_2$) mixture, having approximately 10% ozone by weight, were alternately pulsed for 600 cycles into a deposition chamber containing a BPSG substrate. A 590 Å layer of $HfO_2$ was deposited, containing 37 atom % Hf, and 63 atom % oxygen. The layer of $HfO_2$ was, surprisingly, free of carbon and nitrogen within detection limits of XPS at a substrate temperature of approximately 220° C.

The complete disclosures of the patents, patent documents, and publications cited herein are incorporated by reference in their entirety as if each were individually incorporated. Various modifications and alterations to this invention will become apparent to those skilled in the art without departing from the scope and spirit of this invention. It should be understood that this invention is not intended to be unduly limited by the illustrative embodiments and examples set forth herein and that such examples and embodiments are presented by way of example only with the scope of the invention intended to be limited only by the claims set forth herein as follows.

What is claimed is:

1. A method of manufacturing a semiconductor structure, the method comprising:
   providing a semiconductor substrate or substrate assembly;
   providing a precursor compound consisting of the formula $Si(NR^1R^2)_xZ_y$, wherein:
   $R^1$ and $R^2$, are each independently hydrogen, or an organic group;
   Z is Cl or H;
   x is 1 to 4; and
   y is 0 to 4;
   providing at least one source of ozone; and
   contacting the at least one precursor compound and the at least one source of ozone to form a silicon oxide layer on one or more surfaces of the semiconductor substrate or substrate assembly using an atomic layer deposition process that includes a plurality of deposition cycles.

2. A method of manufacturing a semiconductor structure, the method comprising:
   providing a semiconductor substrate or substrate assembly within a deposition chamber;
   providing a vapor comprising a precursor compound consisting of the formula $Si(NR^1R^2)_xZ_y$, wherein:
   $R^1$ and $R^2$ are each independently hydrogen or an organic group;
   Z is Cl or H;
   x is 1 to 4; and
   y is 0 to 4;

providing a vapor comprising at least one source of ozone; and contacting the at least one precursor compound and the at least one source of ozone to form a silicon oxide layer on one or more surfaces of the semiconductor substrate or substrate assembly within the deposition chamber using an atomic layer deposition process that includes a plurality of deposition cycles.

3. A method of forming a silicon oxide layer on a substrate, the method comprising:
providing a substrate;
providing a precursor compound consisting of the formula Si(NR$^1$R$^2$)$_x$Z$_y$, wherein:
R$^1$ and R$^2$ are each independently hydrogen or an organic group;
Z is Cl or H;
x is 1 to 4; and
y is 0 to 4;
providing at least one source of ozone; and
contacting the precursor compounds and the at least one source of ozone to form a silicon oxide layer on one or more surfaces of the substrate using an atomic layer deposition process that includes a plurality of deposition cycles.

4. A method of forming a silicon oxide layer on a substrate, the method comprising:
providing a substrate within a deposition chamber;
providing a vapor comprising a precursor compound consisting of the formula Si(NR$^1$R$^2$)$_x$Z$_y$, wherein:
R$^1$ and R$^2$ are each independently hydrogen or an organic group;
Z is Cl or H;
x is 1 to 4; and
y is 0 to 4;
providing a vapor comprising at least one source of ozone; and
contacting the at least one precursor compound and the at least one source of ozone to form a silicon oxide layer on one or more surfaces of the substrate within the deposition chamber using an atomic layer deposition process that includes a plurality of deposition cycles.

5. The method of claim 1 wherein the silicon oxide layer is essentially free of carbon, nitrogen, and halogens, or compounds thereof.

6. The method of claim 1 wherein the semiconductor substrate or substrate assembly is a silicon wafer.

7. The method of claim 1 wherein the silicon oxide layer is an SiO$_2$ insulating layer.

8. The method of claim 1 wherein the silicon oxide layer is in the form of an alloy, a solid solution, or a nanolaminate.

9. The method of claim 1 wherein R$^1$ and R$^2$ are each independently hydrogen or organic groups having 1–10 carbon atoms.

10. The method of claim 1 wherein R$^1$ and R$^2$ are each independently organic groups having silicon substituted for one or more carbon atoms.

11. The method of claim 1 wherein the silicon oxide layer has a thickness of about 30 Å to about 100 Å.

12. The method of claim 1 wherein y is 0 and x is 4, thereby providing at least one precursor compound of the formula Si(NR$^1$R$^2$)$_4$.

13. The method of claim 1 wherein the at least one precursor compound is directed to the semiconductor substrate or substrate assembly in the presence of an inert carrier gas.

14. The method of claim 1 wherein during the atomic layer deposition process the silicon oxide layer is formed by alternately introducing the at least one precursor compound and the at least one source of ozone during each deposition cycle.

15. The method of claim 1 wherein the temperature of the semiconductor substrate or substrate assembly is about 25° C. to about 400° C.

16. The method of claim 1 wherein R$^1$ and R$^2$ are each independently hydrogen or a (C1–C8)alkyl moiety.

17. The method of claim 1 wherein R$^1$ and R$^2$ are each independently selected from the group consisting of methyl and ethyl moieties.

18. The method of claim 2 wherein the silicon oxide layer is essentially free of carbon, nitrogen, and halogens, or compounds thereof.

19. The method or claim 2 wherein the semiconductor substrate or substrate assembly is a silicon wafer.

20. The method of claim 2 wherein the silicon oxide layer is an SiO$_2$ insulating layer.

21. The method of claim 2 wherein the silicon oxide layer is in the form of an alloy, a solid solution, or a nanolaminate.

22. The method of claim 2 wherein R$^1$ and R$^2$ are each independently hydrogen or organic groups having 1–10 carbon atoms.

23. The method of claim 2 wherein R$^1$ and R$^2$ are each independently organic groups having silicon substituted for one or more carbon atoms.

24. The method of claim 2 wherein the silicon oxide layer has a thickness of about 30 Å to about 100 Å.

25. The method of claim 2 wherein y is 0 and x is 4, thereby providing at least one precursor compound of the formula Si(NR$^1$R$^2$)$_4$.

26. The method of claim 2 wherein the vapor comprising at least one precursor compound is directed to the semiconductor substrate or substrate assembly in the presence of an inert carrier gas.

27. The method of claim 2 wherein during the atomic layer deposition process the silicon oxide layer is formed by alternately introducing the vapor comprising at least one precursor compound and the vapor comprising at least one source of ozone during each deposition cycle.

28. The method of claim 2 wherein the temperature of the semiconductor substrate or substrate assembly is about 25° C. to about 400° C.

29. The method of claim 2 wherein R$^1$ and R$^2$ are each independently hydrogen or a (C1–C8)alkyl moiety.

30. The method of claim 2 wherein R$^1$ and R$^2$ are each independently selected from the group consisting of methyl and ethyl moieties.

31. The method of claim 3 wherein the silicon oxide layer is essentially free of carbon, nitrogen, and halogens, or compounds thereof.

32. The method of claim 3 wherein the substrate is a silicon wafer.

33. The method of claim 3 wherein the silicon oxide layer is an SiO$_2$ insulating layer.

34. The method of claim 3 wherein the silicon oxide layer is in the form of an alloy, a solid solution, or a nanolaminate.

35. The method of claim 3 wherein R$^1$ and R$^2$ are each independently hydrogen or organic groups having 1–10 carbon atoms.

36. The method of claim 3 wherein R$^1$ and R$^2$ are each independently organic groups having silicon substituted for one or more carbon atoms.

37. The method of claim 3 wherein the silicon oxide layer has a thickness of about 30 Å to about 100 Å.

38. The method of claim 3 wherein y is 0 and x is 4, thereby providing at least one precursor compound of the formula $Si(NR^1R^2)_4$.

39. The method of claim 3 wherein the at least one precursor compound is directed to the substrate in the presence of an inert carrier gas.

40. The method of claim 3 wherein during the atomic layer deposition process the silicon oxide layer is formed by alternately introducing the at least one precursor compound and the at least one source of ozone during each deposition cycle.

41. The method of claim 3 wherein the temperature of the substrate is about 25° C. to about 400° C.

42. The method of claim 3 wherein $R^1$ and $R^2$ are each independently hydrogen or a (C1–C8)alkyl moiety.

43. The method of claim 3 wherein $R^1$ and $R^2$ are each independently selected from the group consisting of methyl and ethyl moieties.

44. The method of claim 4 wherein the silicon oxide layer is essentially free of carbon, nitrogen, and halogens, or compounds thereof.

45. The method of claim 4 wherein the substrate is a silicon wafer.

46. The method of claim 4 wherein the silicon oxide layer is an $SiO_2$ insulating layer.

47. The method of claim 4 wherein the silicon oxide layer is in the form of an alloy, a solid solution, or a nanolaminate.

48. The method of claim 4 wherein $R^1$ and $R^2$ are each independently hydrogen or organic groups having 1–10 carbon atoms.

49. The method of claim 4 wherein $R^1$ and $R^2$ are each independently organic groups having silicon substituted for one or more carbon atoms.

50. The method of claim 4 wherein the silicon oxide layer has a thickness of about 30 Å to about 100 Å.

51. The method of claim 4 wherein y is 0 and x is 4, thereby providing at least one precursor compound of the formula $Si(NR^1R^2)_4$.

52. The method of claim 4 wherein the vapor comprising at least one precursor compound is directed to the substrate in the presence of an inert carrier gas.

53. The method of claim 4 wherein during the atomic layer deposition process the silicon oxide layer is formed by alternately introducing the vapor comprising at least one precursor compound and the vapor comprising at least one source of ozone during each deposition cycle.

54. The method of claim 4 wherein the temperature of the substrate is about 25° C. to about 400° C.

55. The method of claim 4 wherein $R^1$ and $R^2$ are each independently hydrogen or a (C1–C8)alkyl moiety.

56. The method of claim 4 wherein $R^1$ and $R^2$ are each independently selected from the group consisting of methyl and ethyl moieties.

* * * * *

UNITED STATES PATENT AND TRADEMARK OFFICE
CERTIFICATE OF CORRECTION

PATENT NO.         : 7,115,528 B2                                      Page 1 of 1
APPLICATION NO. : 10/425514
DATED                 : October 3, 2006
INVENTOR(S)        : Vaartstra et al.

It is certified that error appears in the above-identified patent and that said Letters Patent is hereby corrected as shown below:

On page 2, column 2, in the first citation of Ohshita et al., delete "233-292-7" and insert --233:292-7--.

On page 2, column 2, in the citation of Vehkamäki et al., delete "SrTiO$_3$ thin" and insert --SrTiO$_3$ and BaTiO$_3$ thin--.

On page 2, column 2, in the citation of Feingold and Katz, delete "gilm" and insert --film--.

In column 16, line 47 (Claim 1), delete "Cl" and insert -- Cl--.

Signed and Sealed this

Ninth Day of January, 2007

JON W. DUDAS
*Director of the United States Patent and Trademark Office*